United States Patent
Suzuki (10) Patent No.: US 6,590,514 B2
(45) Date of Patent: Jul. 8, 2003

(54) D/A CONVERTER CIRCUIT

(75) Inventor: Hisao Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/972,886

(22) Filed: Oct. 10, 2001

(65) Prior Publication Data

US 2002/0158787 A1 Oct. 31, 2002

(30) Foreign Application Priority Data

Apr. 25, 2001 (JP) ........................................ 2001-127400

(51) Int. Cl.[7] .............................................. H03M 1/66
(52) U.S. Cl. ........................................ 341/144; 341/153
(58) Field of Search ................................ 341/144, 153, 341/136

(56) References Cited

U.S. PATENT DOCUMENTS

| 6,049,300 A | 4/2000 | Shoval |
| 6,163,289 A | 12/2000 | Ginetti |
| 6,340,939 B1 * | 1/2002 | Dedic ......................... 341/144 |

* cited by examiner

Primary Examiner—Brian Young
(74) Attorney, Agent, or Firm—Arent Fox Kintner Plotkin & Kahn, PLLC (57) ABSTRACT

A D/A converter circuit that converts a digital signal to an analog signal within a short period of time. The A/D converter circuit has a plurality of resistors, which are connected in series between a high potential power supply and a low potential power supply, a first switch group, and a second switch group. The first switch group is formed by switches, which are connected to nodes between the resistors. The second switch group is formed by switches, which are also connected to the nodes. A decoder circuit is connected to the switch groups to selectively close one of the first switches and one of the second switches.

18 Claims, 5 Drawing Sheets

| SW Setting (Decoder Setting) | | | | | | | | | | | | | | | | Output |
|---|---|---|---|---|---|---|---|---|---|---|---|---|---|---|---|---|
| SW1 | SW2 | SW3 | SW4 | SW5 | SW6 | SW7 | SW8 | SW9 | SW10 | SW11 | SW12 | SW13 | SW14 | SW15 | SW16 | |
| OFF | OFF | OFF | OFF | OFF | OFF | OFF | ON | OFF | OFF | OFF | OFF | OFF | OFF | OFF | OFF | 0/8×VD |
| OFF | OFF | OFF | OFF | OFF | OFF | ON | OFF | OFF | ON | OFF | OFF | OFF | OFF | OFF | OFF | 1/8×VD |
| OFF | OFF | OFF | OFF | OFF | ON | OFF | OFF | OFF | OFF | ON | OFF | OFF | OFF | OFF | OFF | 2/8×VD |
| OFF | OFF | OFF | OFF | ON | OFF | OFF | OFF | OFF | OFF | OFF | ON | OFF | OFF | OFF | OFF | 3/8×VD |
| OFF | OFF | OFF | ON | OFF | OFF | OFF | OFF | OFF | OFF | OFF | OFF | ON | OFF | OFF | OFF | 4/8×VD |
| OFF | OFF | ON | OFF | OFF | OFF | OFF | OFF | OFF | OFF | OFF | OFF | OFF | ON | OFF | OFF | 5/8×VD |
| OFF | ON | OFF | OFF | OFF | OFF | OFF | OFF | OFF | OFF | OFF | OFF | OFF | OFF | ON | OFF | 6/8×VD |
| ON | OFF | OFF | OFF | OFF | OFF | OFF | OFF | OFF | OFF | OFF | OFF | OFF | OFF | OFF | ON | 7/8×VD |

D/A CONVERTER CIRCUIT

BACKGROUND OF THE INVENTION

The present invention relates to a D/A converter circuit, and more particularly, to a D/A converter circuit provided with resistors that divide the potential difference between a high potential power supply and a low potential power supply to generate divided voltages.

A D/A converter circuit is a circuit for converting a digital signal to an analog signal. The D/A converter circuit may also be used as an internal circuit of an analog-to-digital converter circuit (A/D converter circuit), which converts an analog signal to a digital signal.

Figure 1:
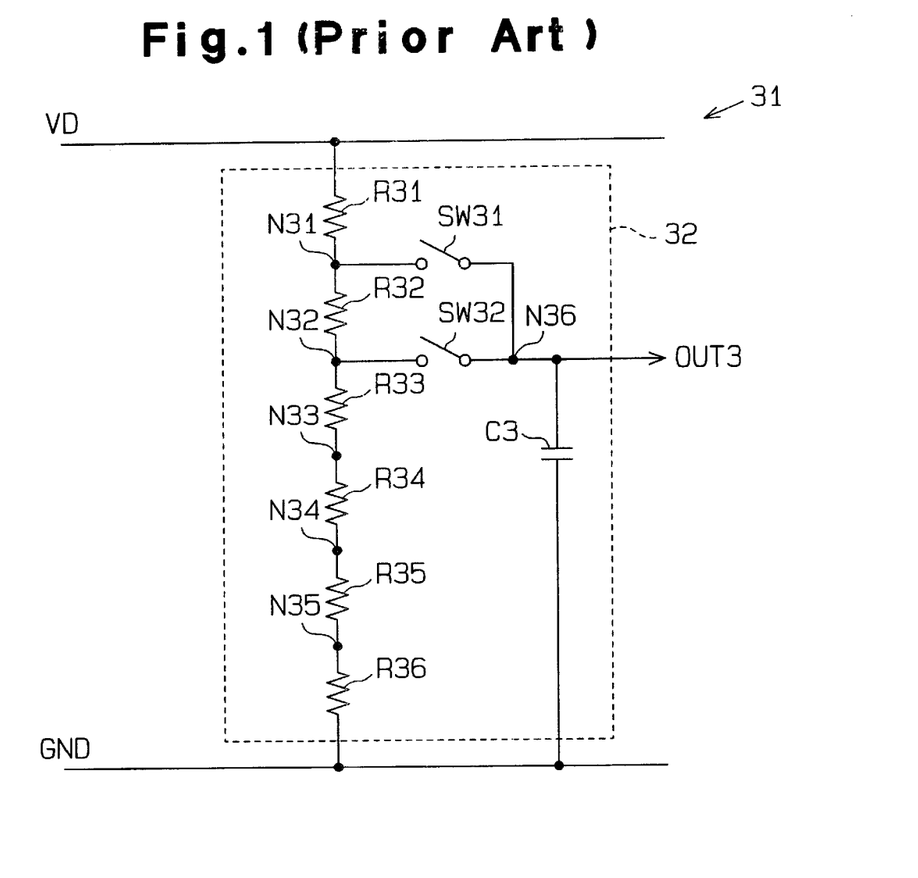
FIG. 1 is a schematic circuit diagram showing a prior art D/A converter circuit.

FIG. 1 is a schematic circuit diagram of a prior art string-type D/A converter circuit 31. The D/A converter circuit 31 includes a voltage dividing circuit 32. The voltage dividing circuit 32 includes a plurality (e.g., six) of resistors R31, R32, R33, R34, R35, R36 connected in series between a high potential power supply VD and a lower potential power supply GND. The resistors R31–R36 have the same resistance. Further, the resistors R31–R36 equally divide the potential difference between the high potential power supply VD and the low potential power supply GND to generate divided voltages at nodes N31, N32, N33, N34, N35 between the resistors R31–R36.

Each of the nodes N31–N35 (nodes connected to the high potential power supply VD and the low potential power supply GND may also be included) is connected to the same output terminal by a switch. FIG. 1 shows only switches SW31, SW32 respectively connected to nodes N31, N32. A decoder circuit (not shown) generates an output formed from a digital signal, which has a plurality of bits, to control the activation and inactivation of each switch.

Accordingly, the D/A converter circuit 31 outputs an analog signal OUT3 having a divided voltage that is applied at the node that is associated with the switch activated by the digital signal of the decoder circuit. A first capacitor C3, which is shown in FIG. 1, includes the capacitance of each switch and the capacitance of a succeeding stage circuit (not shown), which is connected to the output terminal of the D/A converter circuit 31.

The D/A converter circuit 31 requires a relatively long period of time from when the activation and inactivation of the switches SW31, SW32 is switched to when the set voltage at node N36 is generated.

When the digital signal activates the switch SW31 to output the analog signal OUT3 at a divided voltage of 5/6×VD, and then the switch SW31 is inactivated and the switch SW32 is activated, the divided voltage at node N32 is lower than that at node N31. The discharging of the capacitor C3 decreases the voltage at node N36. This causes the voltage at node N36 to be substantially the same as that at node N32.

On the other hand, when the digital signal activates the switch SW32 to output the analog signal OUT3 at a divided voltage of 4/6×VD, and then the switch SW32 is inactivated and the switch SW31 is activated, the divided voltage at node N31 is higher than that at node N32. The charging of the capacitor C3 increases the voltage at node N36. This causes the voltage at N36 to be substantially the same as that at node N31.

The converting period of the D/A converter circuit 31 (i.e., the time required for the voltage at node N36 to stabilize) is determined by the charging/discharging time of the capacitor C3. The resistance of the resistors R31–R36 relative to the capacitance C3 and the ON resistance of each switch determine the charging/discharging time of the capacitor C3.

The resistance of the resistors R31–R36 and the ON resistance of the switches SW31, SW32 may be decreased to reduce the discharging or charging time of the capacitor C3 and shorten the converting time. However, a decrease in the resistance of the resistors R31–R36 increases the current consumption between the high potential power supply VD and the low potential power supply GND. Further, a decrease in the ON resistance of each switch increases the size of the switch, which increases the capacitance component of the switch. As a result, the capacitance of the capacitor C3 increases and hinders reduction of the converting time.

SUMMARY OF THE INVENTION

The object of the present invention is to provide a D/A converter circuit that reduces the time for converting a digital signal to an analog signal.

To achieve the above object, the present invention provides a D/A converter circuit including a plurality of impedance elements connected in series between a first power supply and a second power supply and a plurality of switch groups including a first switch group and a second switch group. The first switch group is formed by a plurality of first switches connected to at least a plurality of nodes between the plurality of impedance elements, and the second switch group is formed by a plurality of second switches connected to at least the plurality of nodes. A control circuit is connected to the switch groups for selectively closing one of the first switches and one of the second switches.

A further perspective of the present invention is a D/A converter circuit including a plurality of resistors connected in series between a first power supply and a second power supply. The plurality of resistors include a first resistor adjacent to the first power supply and a second resistor adjacent to the second power supply. A first switch group is formed by a plurality of first switches connected to a plurality of inter-resistor nodes between the resistors and to a first inter-power source node between the first power supply and the first resistor. A second switch group is formed by a plurality of second switches connected to the inter-resistor nodes and to a second inter-power source node between the second power source and the second resistor. A decoder circuit is connected to the first and second switch groups to selectively close one of the first switches and one of the second switches.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A D/A converter circuit 11 according to a preferred embodiment of the present invention will now be described with reference to FIGS. 2 to 5. The D/A converter circuit 11 includes a voltage dividing circuit 12. The voltage dividing circuit 12 is connected between a high potential power supply VD, which serves as a first power supply, and a low potential power supply GND (in the preferred embodiment, the ground GND), which serves as a second power supply.

Figure 2:
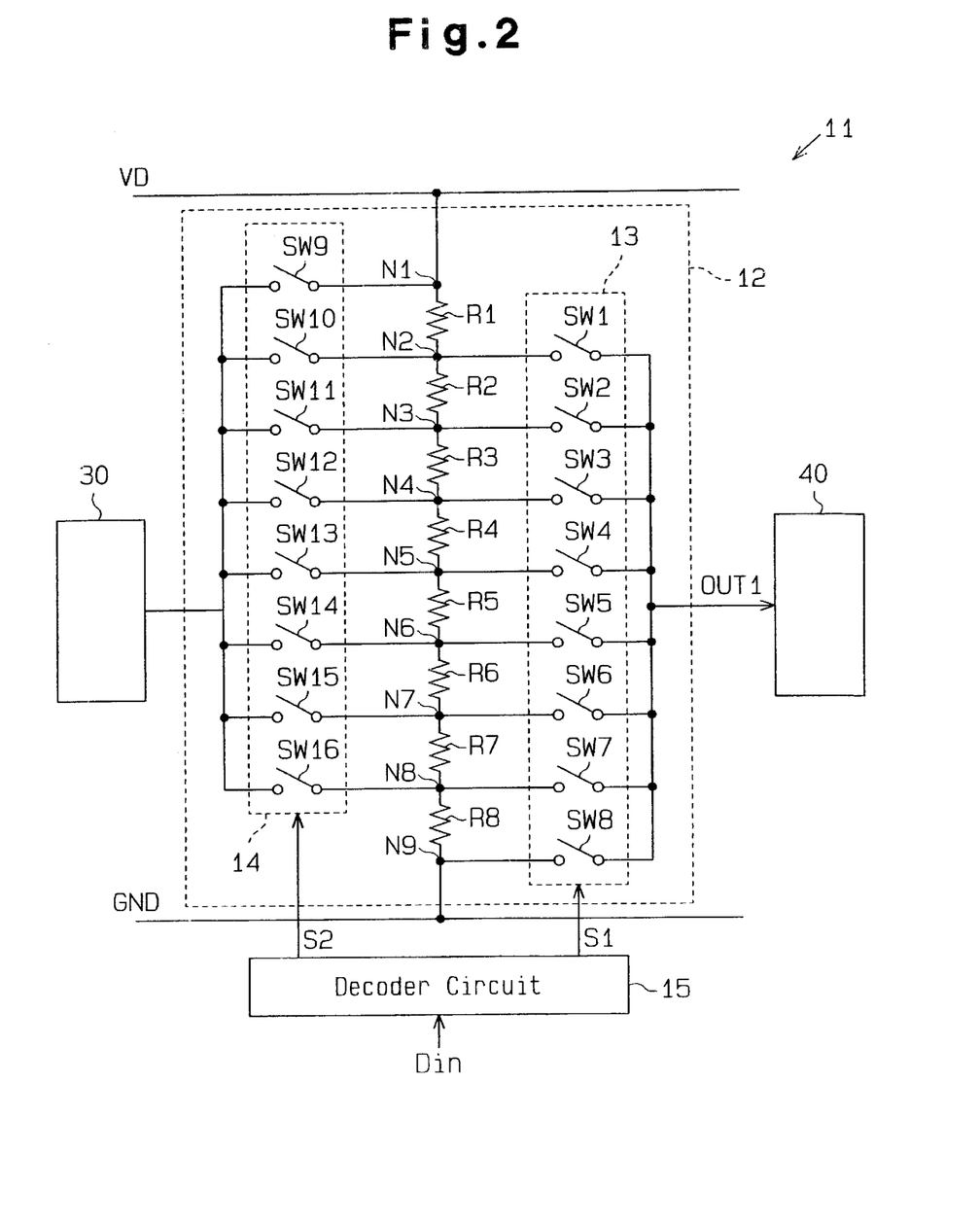
FIG. 2 is a schematic circuit diagram of a D/A converter circuit according to a preferred embodiment of the present invention.

The voltage dividing circuit 12 includes a plurality (e.g., eight) of resistors R1–R8, a first switch group 13, and a second switch group 14. The resistors R1–R8 serve as impedance elements and are connected in series between the high potential power supply VD and the low potential power supply GND.

The resistors R1–R8 have the same resistance and function as voltage dividing resistors that equally divides the potential difference between the high potential power supply VD and the low potential power supply GND. Node N1 is defined between the high potential power supply VD and the resistor R1. Nodes N2–N8 are defined between the resistors R1–R8. Node N9 is defined between the resistor R8 and the low potential power supply GND. The potential differences between each node N1–N9 are substantially equal.

The first switch group 13 includes a plurality (e.g., eight) of switches SW1–SW8. The switches SW1–SW8 have the same ON resistance. Further, the switches SW1–SW8 each have a first terminal and a second terminal. The first terminals of the switches SW1–SW8 are respectively connected to nodes N2–N9. The second terminals of the switches SW1–SW8 are connected to each other. In other words, the switches SW1–SW8 are connected in parallel.

The second switch group 14 includes a plurality (e.g., eight) of switches SW9–SW16. The switches SW9–SW16 have the same ON resistance. Further, the switches SW9–SW16 each have a first terminal and a second terminal. The first terminals of the switches SW9–SW16 are respectively connected to nodes N1–N8. The second terminals of the switches SW9–SW16 are connected to each other. In other words, the switches SW9–SW16 are connected in parallel.

A preceding stage circuit 30 of the D/A converter circuit 11 is connected to the second terminals of the second switch group 14. A succeeding stage circuit 40 of the D/A converter circuit 11 is connected to the second terminals of the first switch group 13. The D/A converter circuit 11 outputs an analog signal OUT1, which is output from an activated one of the switches SW1–SW8 and provided to the succeeding stage circuit 40.

A decoder circuit 15 (control circuit) provides control signals to the switches SW1–SW8 of the first switch group 13 and the switches SW9–SW16 of the second switch group 14 to activate and inactivate the switches SW1–SW8, SW9–SW16.

The decoder circuit 15 receives a digital signal Din having a plurality of bits (in the preferred embodiment, three bits). The decoder circuit 15 generates control signals, which activate and inactivate the switches SW1–SW8 and SW9–SW16, based on the digital signal Din.

Figure 3:
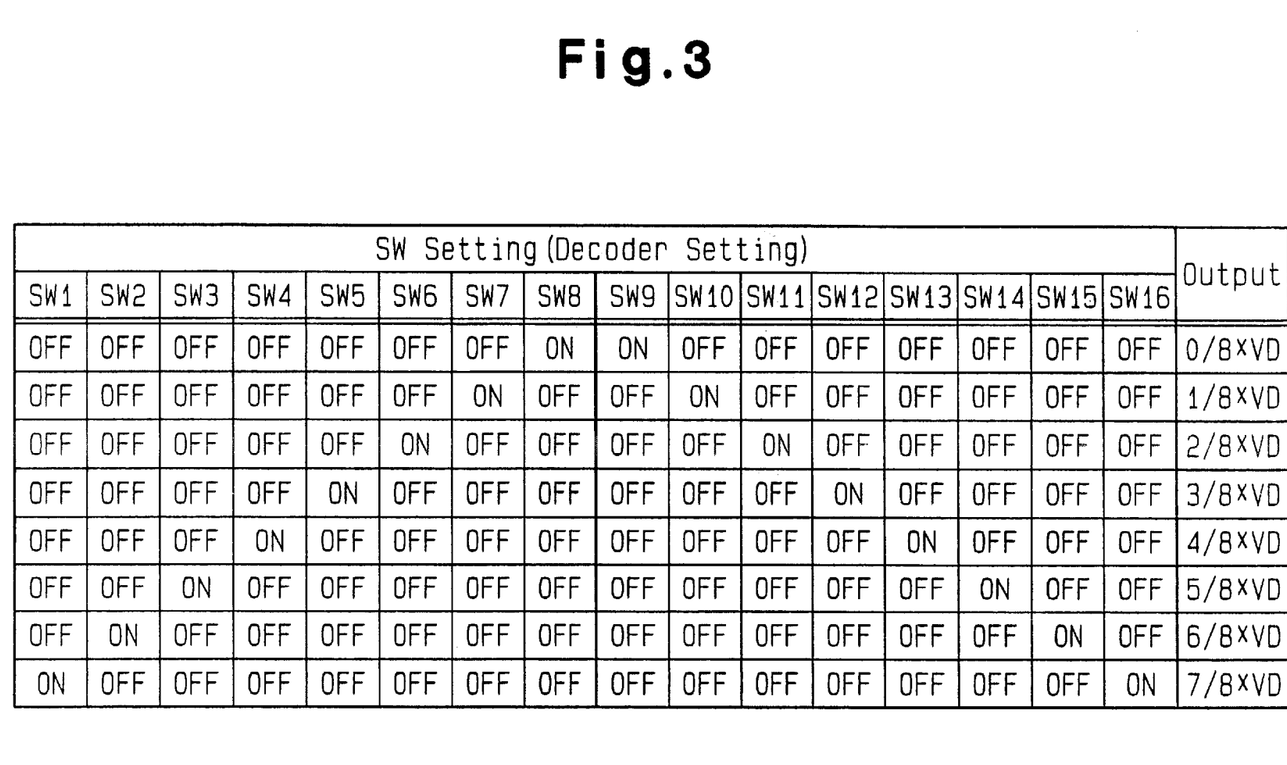
FIG. 3 is a table illustrating the control logic of the D/A converter circuit of FIG. 2.

FIG. 3 is a table illustrating the control logic of the D/A converter circuit 11 used by the decoder circuit 15. The decoder circuit 15 generates first and second control signals S1, S2 based on the three bit digital signal Din to activate one of the switches SW1–SW8 and one of the switches SW9–SW16. In this state, the decoder circuit 15 generates the first and second control signals S1, S2 to simultaneously activate one switch in each of the switch groups 13, 14. The activated switches are determined so that the absolute value of the voltage difference between the node connected to the activated switch of the first switch group 13 and the high potential power supply VD is substantially equal to the absolute value of the voltage difference between the node connected to the activated switch of the second switch group 14 and the low potential power supply GND.

For example, the decoder circuit 15 generates the first and second control signals S1, S2 so that the switch SW1 of the first switch group 13 and the switch SW16 of the second switch group 14 are simultaneously activated. In this state, the absolute value of the voltage difference (first voltage difference absolute value) between node N2, which is connected to the activated switch SW1, and the high potential power supply VD is about the same as the absolute value of the voltage difference (second voltage difference absolute value) between node N8, which is connected to the activated switch SW16, and the low potential power supply GND.

The decoder circuit 15 generates the first control signal S1 based on a digital signal Din of, for example, "000" to activate the switch SW1 and deactivate the other switches SW2–SW8 in the first switch group 13. Further, the decoder circuit 15 generates the second control signal S2 to activate the switch SW16 and deactivate the other switches SW9–SW15 in the second switch group 14. As a result, the voltage dividing circuit 12 generates an analog signal OUT1 having the divided voltage at N2, which is 7/8×VD, via the activated switch SW1. Referring to FIG. 3, the decoder circuit 15 simultaneously activates one of the switches SW1–SW8 and one of the switches SW9–SW16 based on the digital signal Din. In this manner, the voltage dividing circuit 12 outputs the divided voltage at the node associated with the activated one of the switches SW1–SW8. In other words, the voltage dividing circuit 12 outputs one of the divided voltages of 0/8×VD to 7/8×VD at nodes N2–N9 via the activated one of the switches SW1–SW8.

Figure 4:
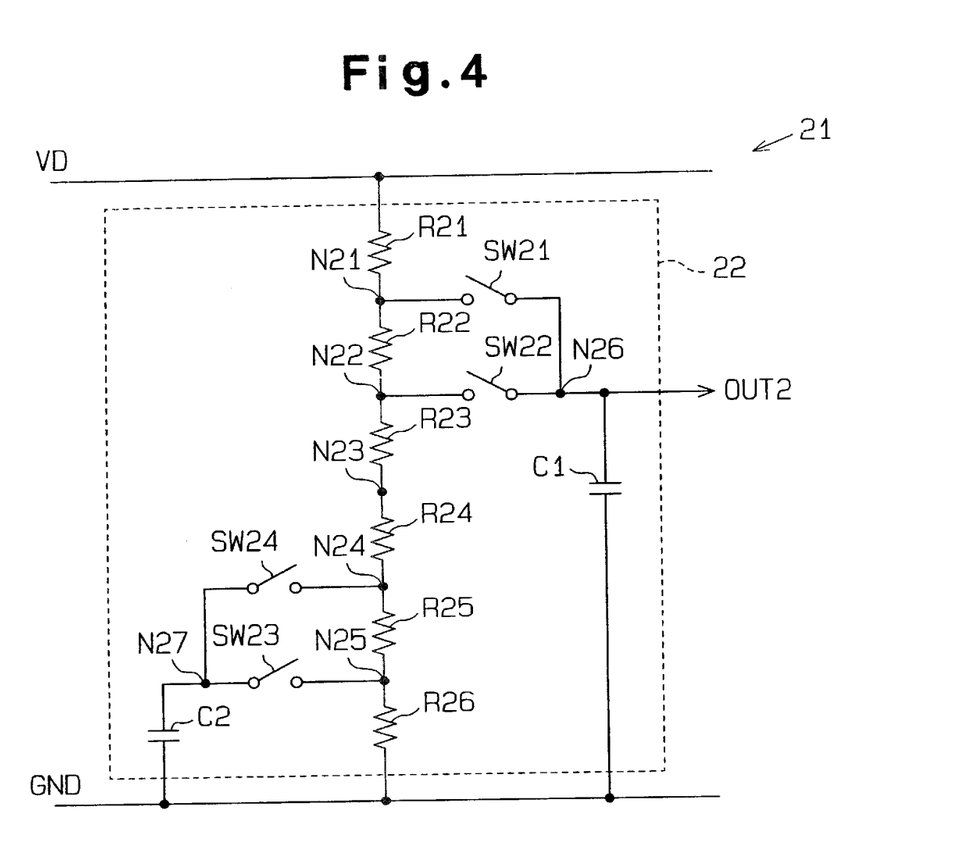
FIG. 4 is a schematic diagram illustrating the principle of the present invention.

The operating principle of the D/A converter circuit 11 will now be described with reference to FIG. 4. FIG. 4 shows a D/A converter circuit 21, which is used to illustrate the principle of the D/A converter circuit 11 of FIG. 2. The D/A converter circuit 21 includes a voltage dividing circuit 22 connected between a high potential power supply VD and a low potential power supply GND. In the D/A converter circuit 21, the voltage at the high potential power supply VD is 3.0V (volts) and the voltage of the low potential power supply GND is 0.0V (volts).

The voltage dividing circuit 22 includes resistors R21–R26 connected in series between the high potential power supply VD and the low potential power supply GND. The resistors R21–R26 have the same resistance. In other words, each resistor R21–R26 functions as a voltage dividing resistor that equally divides the potential difference between the high potential power supply VD and the low potential power supply GND. Accordingly, at nodes N21–N25 between the resistors R21–R26, the potential difference between the high potential power supply VD and node N21, the potential differences between adjacent nodes N21–N25, and the potential difference between node N25 and the low potential power supply GND are about the same.

Each node N21–N25 is connected to first terminals of switches, which form a first switch group. The switches of the first switch group have second terminals, which are connected to one another. In the same manner, each node N21–N25 is connected to second terminals of switches, which form a second switch group. The switches of the second switch group have first terminals, which are connected to one another. FIG. 4 shows only switches SW21, SW22 of the first switch group and switches SW23, SW24 of the second switch group. The switches SW21, SW22, SW23, and SW24 are respectively connected to nodes N21, N22, N25, and N24. In FIG. 4, a first capacitor C1 includes the capacitance of each switch in the first switch group and the capacitance of a succeeding stage circuit (not shown) that is connected to node N26. A second capacitor C2 includes the capacitance of each switch in the second switch group and the capacitance of a preceding stage circuit (not shown) that is connected to node N27.

A decoder circuit (not shown) generates control signals based on a digital signal to simultaneously activate one of the switches in the first switch group and one of the switches in the second switch group. That is, the decoder circuit generates a first control signal and a second control signal to activate and inactivate each switch of the first and second switch groups based on the digital signal. More specifically, the decoder circuit generates the first and second control signals to simultaneously activate one switch in each of the switch groups. The activated switches are determined so that the absolute value of the voltage difference between the node connected to the activated switch of the first switch group and the high potential power supply VD is substantially equal to the absolute value of the voltage difference between the node connected to the activated switch of the second switch group and the low potential power supply.

The D/A converter circuit 21 outputs an analog signal OUT2 having the divided voltage at the node connected to the activated switch of the first switch group.

Figure 5A:
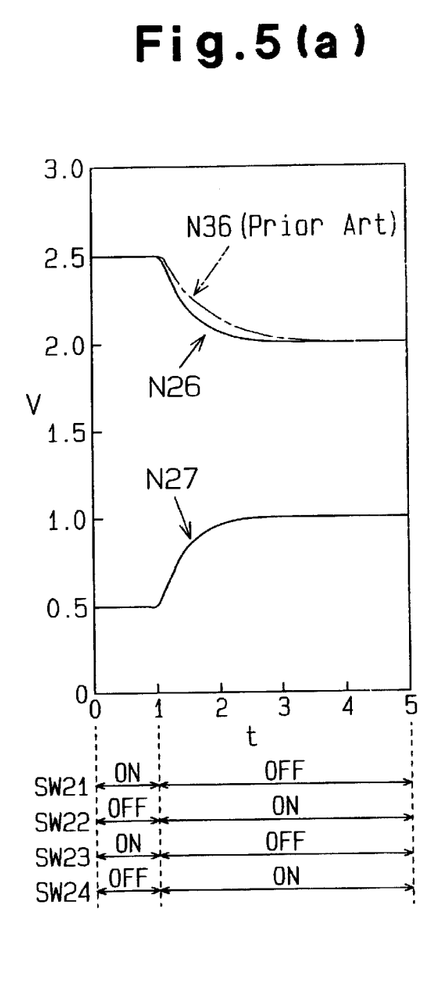
FIGS. 5(a) and 5(b) are diagrams respectively showing the waveform of an output voltage of a voltage dividing circuit and an internal node voltage of the voltage dividing circuit.

For example, if the switch SW21 of the first switch group and the switch SW23 of the second switch group are activated, the divided voltage at node N21 (5/6×VD=2.5V) is applied to node N26 via the activated switch SW21, as shown in FIG. 5(a). In other words, an analog signal OUT2 having divided voltage 2.5V is output from node N26. This charges the first capacitor C1 to 2.5V.

Further, referring to FIG. 5(a), the activated switch SW23 applies the divided voltage at node N25 (1/6×VD=0.5V) to node N27. This charges the second capacitor C2 to 0.5V.

Figure 5B:
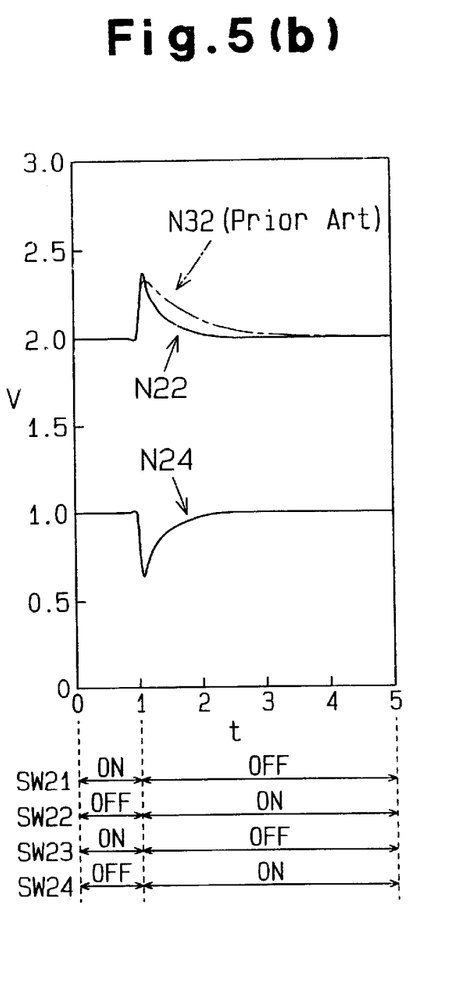

Then, at time t1, the switches SW22, SW24 are activated and the switches SW21, SW23 are inactivated. This switches the node connected to the first capacitor C1 from N21 to N22, while the first capacitor C1 remains charged at 2.5V. The divided voltage at node N22 (4/6×VD=2.0V) is lower than the divided voltage at node N21 (2.5V). Accordingly, voltage that is higher than the divided voltage (2.0V) is applied to node N22, as shown in FIG. 5(b). That is, in the first capacitor C1, a charge of 0.5V becomes excessive immediately after the switching the activated switches.

Further, the activation of the switches SW22, SW24 and the inactivation of the switches SW21, SW23 switches the node connected to the second capacitor C2 from N25 to N24, while the second capacitor C2 remains charged at 0.5V. The divided voltage at node N24 (2/6×VD=1.0V) is higher than the divided voltage at node N25 (0.5V). Accordingly, referring to FIG. 5(b), voltage lower than the divided voltage (1.0V) is applied to node N24. That is, in the second capacitor C2, a charge of 0.5V becomes deficient immediately after switching the activated switches.

The excess charge of 0.5V in the first capacitor C1 is discharged from the second capacitor C2 through the switch SW22, the resistors R23, R24, and the switch SW24. That is, the excess charge of the first capacitor C is transferred to compensate for the deficient charge of the second capacitor C2. This decreases the potential at node N22, as shown in FIG. 5(b), and the potential at node N26 is stabilized at the same potential as that at node N22. Further, the potential at node N24 increases, and the potential at node N27 is stabilized at the same potential as that at node N24.

As shown in FIG. 5(a), the potential at node N26 stabilizes at around time t3. That is, the time required for voltage conversion by switching switches is the time spanning from time t1, at which the activated switches are switched, to time t3, at which the potential at node N26 stabilizes.

Referring to FIGS. 5(a) and 5(b), the broken lines show the waveforms of the output voltage at nodes N32, N36 in the prior art D/A converter circuit 31 of FIG. 1 when the voltage of the high potential power supply VD is 3.0V and the voltage of the low potential power supply GND is 0.0V.

When the switch SW31 is activated in the prior art D/A converter circuit 31, a divided voltage of 2.5V is generated at node N31. If the switch SW31 is inactivated from this state at time t1, the excess charge of the capacitor C3 applies to node N32 a voltage that is higher than the divided voltage (2.0V) at node N32, as shown by the broken line in FIG. 5(b). The switching of the activated switches SW31, SW32 discharges the excess charge of the capacitor C3 to the low potential power supply GND via the switch SW32 and the four resistors R33–R36.

In this state, as shown by the broken line in FIG. 5(a), the potential at node N36 stabilizes at around time t4. That is, the time required for voltage conversion by switching the switches SW31, SW32 is the time spanning from time t1, at which the activated switches are switched, to time t4, at which the potential at node N36 stabilizes.

Referring to FIG. 4, in the preferred embodiment, the first switch group includes the switches SW21, SW22 and the second switch group includes the switches SW23, SW24. This structure discharges the excess charge of the first capacitor C1 to the second capacitor C2 through a route having a small resistance (e.g., the resistances R23, R24) and reduces the discharge time. Accordingly, the voltage conversion time when switching the activated switches is reduced, as shown in FIG. 5(a).

The D/A converter circuit 11 of FIG. 2 has a first capacitance (corresponding to the first capacitor C1 of FIG. 4), which includes the capacitance of the elements in the first switch group 13 and the capacitance of the succeeding stage circuit 40 of the D/A converter circuit 11. Further, the D/A converter circuit 11 has a second capacitance (corresponding to the second capacitor C2 of FIG. 4), which includes the capacitance of the elements in the second switch group 14 and the capacitance of a preceding stage circuit 30 of the D/A converter circuit 11.

In the D/A converter circuit 11 of FIG. 2, a capacitor corresponding to the first capacitance may be connected to the second terminals of the switches SW1–SW8 of the first switch group 13. Further, a capacitor corresponding to the second capacitance may be connected to the second terminals of the switches SW9–SW16 of the second switch group 14.

When the activated switches in the first switch group 13 and the second switch group 14 are switched based on the decoder circuit control logic of FIG. 3, the charging or discharging of the first capacitor, which is excess or deficient in charge, is performed through a route formed by the resistors R1–R8 that produce a small resistance.

When the switch SW1 of the first switch group 13 is activated and the switch SW16 of the second switch group 14 is activated, and then the switches SW1, SW16 are deactivated and the switches SW2, SW15 are activated, the excess charge of the first capacitor is discharged to the second capacitor through the four resistors R3–R6.

For example, if the switches SW1, SW16 are activated, and the switches SW4, SW13 are activated afterward, the excess charge of the first capacitor is discharged to the second capacitor without passing through a resistor. In other words, the time for discharge from the first capacitor to the second capacitor is shortest when the switches SW4, SW13, which are connected to node N5, are simultaneously activated in such manner. Accordingly, in this case, the voltage conversion time is shortest.

The voltage conversion time is shortened in the same manner when the second capacitor charges the first capacitor.

For example, if the switches SW8, SW9 are first activated, and the switches SW4, SW13 are then activated, the deficient charge of the first capacitor is compensated for directly by the second capacitor without a resistor. That is, the time for charging the first capacitor with the second capacitor is shortest. Accordingly, in this case, the voltage conversion time is shortest.

The D/A converter circuit 11 of the preferred embodiment has the advantages discussed below.

(1) The voltage dividing circuit 12 includes the resistors R1–R8, which have the same resistance, the first switch group 13, and the second switch group 14. The resistors R1–R8 are connected in series between the high potential power supply VD and the low potential power supply GND to equally divide the potential difference between the high potential power supply VD and the low potential power supply GND. Based on the digital signal Din, the decoder circuit 15 activates one of the switches SW1–SW8 in the first switch group 13 and one of the switches SW9–SW16 in the second switch group 14. The activated switches are determined so that the absolute value of a first voltage difference between the node connected to the activated switch of the first switch group 13 and the high potential power supply VD is substantially equal to the absolute value of a second voltage difference between the node connected to the activated switch of the second switch group 14 and the low potential power supply GND. Accordingly, when switching the activated switches, a first capacitor, which includes the element capacitance of the first switch group 13 and the capacitance of a succeeding stage circuit of the D/A converter circuit 11, is charged or discharged through a route having a small resistance. This reduces the voltage conversion time of the analog signal OUT1.

(2) At one of nodes N2–N8, the connected one of the switches SW1–SW8 of the first switch group 13 and the connected one of the switches SW9–SW16 are simultaneously activated. Accordingly, the time for converting voltage is reduced regardless of the resistance of the resistors R1–R8. This reduces the voltage conversion time without increasing the current consumption between the high potential power supply VD and the low potential power supply GND.

It should be apparent to those skilled in the art that the present invention may be embodied in many other specific forms without departing from the spirit or scope of the invention. Particularly, it should be understood that the present invention may be embodied in the following forms.

The number of the resistors R1–R8 and the switches SW1–SW8, SW9–SW16 may be changed as required.

The number of bits in the digital signal Din may be changed as required.

A low potential power supply having a power supply voltage lower than that of the high potential power supply may be used in lieu of the ground GND.

A third switch group formed by a plurality of switches respectively connected to nodes N1–N9 may be provided.

The voltage dividing circuit 12, which includes the two switch groups 13, 14, may be connected in series to another voltage dividing circuit to provide four or more switch groups.

The absolute value of the first voltage difference between the activated switch of the first switch group 13 and the high potential power supply VD and the absolute value of the second voltage difference between the activated switch of the second switch group 14 and the low potential power supply GND do not necessarily have to be the same. The switches of the first and second switch groups 13, 14 arranged symmetrically relative to a predetermined node (or resistor) may be activated or deactivated. For example, in the D/A converter circuit 11 of FIG. 2, the switch SW2 and the switch SW11 may be simultaneously activated. In this case, the voltage conversion time when the switches SW2, SW11 are activated is shortest.

The present examples and embodiments are to be considered as illustrative and not restrictive, and the invention is not to be limited to the details given herein, but may be modified within the scope and equivalence of the appended claims.

What is claimed is:

1. A voltage dividing circuit comprising:
   a plurality of impedance elements connected in series between a first power supply and a second power supply;
   a plurality of switch groups including a first switch group and a second switch group, wherein the first switch group is formed by a plurality of first switches connected to at least a plurality of nodes between the plurality of impedance elements, and the second switch group is formed by a plurality of second switches connected to at least the plurality of nodes; and
   a control circuit connected to the switch groups for selectively closing one of the first switches and one of the second switches.

2. The voltage dividing circuit according to claim 1, wherein the control circuit selectively closes the one of the first switches and the one of the second switches that are symmetrically arranged relative to a predetermined one of the plurality of nodes.

3. The voltage dividing circuit according to claim 1, wherein the control circuit selectively closes the one of the first switches and the one of the second switches that are symmetrically arranged relative to a predetermined one of the plurality of impedance elements.

4. The voltage dividing circuit according to claim 1, wherein the control circuit simultaneously closes the one of the first switches and the one of the second switches.

5. The voltage dividing circuit according to claim 1, wherein a first node voltage is generated at a first node connected to the closed one of the first switches, and a second node voltage is generated at a second node connected to the closed one of the second switches, the control circuit closing the one of the first switches and the one of the second switches so that an absolute value of a first voltage difference between the first node voltage and the voltage of the first power supply is substantially the same as an absolute value of a second voltage difference between the second node voltage and the voltage of the second power supply.

6. The voltage dividing circuit according to claim 1, wherein the number of the first switches and the number of the second switches are the same, and the first and second switches each have the same ON resistance.

7. The voltage dividing circuit according to claim 1, wherein the impedance elements each have the same impedance.

8. The voltage dividing circuit according to claim 1, wherein the first power supply is a high potential power supply and the second power supply is a low potential power supply.

9. A voltage dividing circuit comprising:
 a plurality of resistors connected in series between a first power supply and a second power supply, wherein the plurality of resistors include a first resistor adjacent to the first power supply and a second resistor adjacent to the second power supply;
 a first switch group formed by a plurality of first switches connected to a plurality of inter-resistor nodes between the resistors;
 a second switch group formed by a plurality of second switches connected to the inter-resistor nodes; and
 a decoder circuit connected to the first and second switch groups for selectively closing one of the first switches and one of the second switches.

10. The voltage dividing circuit according to claim 9, wherein one of the plurality of first switches is connected to a first inter-power source node between the first power supply and the first resistor, and one of the plurality of second switches is connected to a second inter-power source node between the second power source and the second resistor.

11. The voltage dividing circuit according to claim 9, wherein the decoder circuit selectively closes the one of the first switches and the one of the second switches that are symmetrically arranged relative to a predetermined one of the plurality of inter-resistor nodes.

12. The voltage dividing circuit according to claim 9, wherein the decoder circuit selectively closes the one of the first switches and the one of the second switches that are symmetrically arranged relative to a predetermined one of the plurality of resistors.

13. The voltage dividing circuit according to claim 9, wherein a first node voltage is generated at a first inter-resistance node connected to the closed one of the first switches, and a second node voltage is generated at a second inter-resistance node connected to the closed one of the second switches, the decoder circuit closing the one of the first switches and the one of the second switches so that an absolute value of a first voltage difference between the first node voltage and the voltage of the first power supply and an absolute value of a second voltage difference between the second node voltage and the voltage of the second power supply are substantially the same.

14. The voltage dividing circuit according to claim 9, wherein the number of the first switches and the number of the second switches are the same, and the first and second switches each have the same ON resistance.

15. The voltage dividing circuit according to claim 9, wherein the impedance elements each have the same impedance.

16. The voltage dividing circuit according to claim 9, wherein the first power supply is a high potential power supply and the second power supply is a low potential power supply.

17. A D/A converter circuit comprising:
 a plurality of impedance elements connected in series between a first power supply and a second power supply;
 a plurality of switch groups including a first switch group and a second switch group, wherein the first group is formed by a plurality of first switches connected to at least a plurality of nodes between the plurality of impedance elements, and the second switch group is formed by a plurality of second switches connected to at least the plurality of nodes; and
 a control circuit connected to the switch groups for selectively closing one of the first switches and one of the second switches.

18. A D/A converter circuit comprising:
 a plurality of resistors connected in series between a first power supply and a second power supply, wherein the plurality of resistors include a first resistor adjacent to the first power supply and a second resistor adjacent to the second power supply;
 a first switch group formed by a plurality of first switches connected to a plurality of inter-resistor nodes between the resistors;
 a second switch group formed by a plurality of second switches connected to the inter-resistor nodes; and
 a decoder circuit connected to the first and second switch groups for selectively closing one of the first switches and one of the second switches.

* * * * *